United States Patent [15] 3,669,887
Nishida et al. [45] *June 13, 1972

[54] PIEZOELECTRIC CERAMIC COMPOSITIONS

[72] Inventors: Masamitsu Nishida, Osaka-shi, Osaka-fu; Hiromu Ouchi, Toyonaka-shi, Osaka-fu, both of Japan

[73] Assignee: Matsushita Electric Industrial Co., Ltd., Kadoma, Osaka, Japan

[ * ] Notice: The portion of the term of this patent subsequent to Sept. 15, 1987, has been disclaimed.

[22] Filed: July 30, 1969

[21] Appl. No.: 846,037

[30] Foreign Application Priority Data

Aug. 8, 1968 Japan....................................43/56898

[52] U.S. Cl................................................252/62.9, 106/39
[51] Int. Cl.....................................C04b 35/46, C04b 35/48
[58] Field of Search...................................252/62.9; 106/39

[56] References Cited

UNITED STATES PATENTS

| | | | |
|---|---|---|---|
| 3,268,453 | 8/1966 | Ouchi et al. | 252/62.9 |
| 3,518,199 | 6/1970 | Tsubouchi et al. | 252/62.9 |
| 3,528,918 | 9/1970 | Nishida et al. | 252/62.9 |

*Primary Examiner*—Tobias E. Levow
*Assistant Examiner*—J. Cooper
*Attorney*—Wenderoth, Lind & Ponack

[57] ABSTRACT

Piezoelectric ceramic compositions having very high mechanical quality factors and electromechanical coupling coefficients and high stabilities in resonant frequency and mechanical quality factor over a wide temperature range comprising the solid solutions defined by the lines connecting points A, B, C, D and E and the lines connecting points F, G, H, I, J and K of the diagram of FIG. 2 and further containing from 0.1 to 5 percent of $MnO_2$.

7 Claims, 2 Drawing Figures

MASAMITSU NISHIDA and
HIROMU OUCHI, Inventor

By Wenderoth, Lind & Ponack
Attorneys

PIEZOELECTRIC CERAMIC COMPOSITIONS

BACKGROUND OF THE INVENTION

This invention relates to piezoelectric ceramic compositions and articles of manufacture fabricated therefrom. More particularly, the invention pertains to novel ferroelectric ceramics which comprise polycrystalline aggregates of certain constituents. These piezoelectric compositions are sintered to ceramics by ordinary ceramic techniques and thereafter the ceramics are polarized by applying a D-C voltage between the electrodes to impart thereto electromechanical transducing properties similar to the well known piezoelectric effect. The invention also encompasses the calcined intermediate product of raw ingredients and the articles of manufacture such as electromechanical transducers fabricated from the sintered ceramic.

The use of piezoelectric materials in various transducer applications in the production, measurement and sensing of sound, shock, vibration, pressure, etc. have increased greatly in recent years. Both crystal and ceramic types of transducers have been widely used. But, because of their potentially lower cost and ease of use in the fabrication of ceramics of various shapes and sizes and their greater durability at high temperatures and/or high humidities than that of crystalline substances such as Rochelle salt, etc., piezoelectric ceramic materials have recently come into prominent use in various transducer applications.

The piezoelectric characteristics required of ceramics apparently vary depending upon the intended application. For example, electromechanical transducers such as those intended for phonograph pick-up and microphone elements require piezoelectric ceramics characterized by a substantially high electromechanical coupling coefficient and dielectric constant. On the other hand, in the ceramic filter and piezoelectric transformer applications of piezoelectric ceramics it is desirable that the materials exhibit a higher value of mechanical quality factor and a high electromechanical coupling coefficient. Furthermore, ceramic materials require a high stability in resonant frequency and in other electrical properties over wide temperature and time ranges.

As a promising ceramic for these applications, lead titanate-lead zirconate has been in wide use up to now. However, it is difficult to get a very high mechanical quality factor along with a high planar coupling coefficient in the conventional lead titanate-lead zirconate ceramics. Moreover, the dielectric and piezoelectric properties of the lead titanate-lead zirconate ceramics vary greatly depending upon the firing technique employed due to the evaporation of PbO.

SUMMARY OF THE INVENTION

It is, therefore, the fundamental object of the present invention to provide novel and improved piezoelectric ceramic materials which overcome the problems outlined above. A more specific object of the invention is to provide improved polycrystalline ceramics characterized by very high mechanical quality factors along with high piezoelectric coupling coefficients.

Another object of the invention is the provision of novel piezoelectric ceramic characterized by very high mechanical quality factors, high electromechanical coupling coefficients, and high stabilities in resonant frequency and mechanical quality factor over wide temperature and time ranges.

A further object of the invention is the provision of novel piezo electric ceramic compositions, certain properties of which can be varied to suit various applications.

A still further object of the invention is the provision of improved electromechanical transducers utilizing, as the active elements, electrostatically polarized bodies composed of these novel ceramic compositions.

These objects are achieved by providing ceramic bodies which exist basically in the solid solutions comprising the system $Pb(Sn_{1/3}Nb_{2/3})O_3$—$PbTiO_3$—$PbZrO_3$, $Pb(Sn_{1/3})O_3$—$PbTiO_3$ or $Pb(Sn_{1/3}Nb_{2/3})O_3$—$PbZrO_3$, all modified with from 0.1 to 5 weight percent of $MnO_2$ additive.

DESCRIPTION OF THE DRAWING

These objects of the invention and the manner of their attainment will be readily apparent from the following description and from the accompanying drawing in which.

Figure 1:
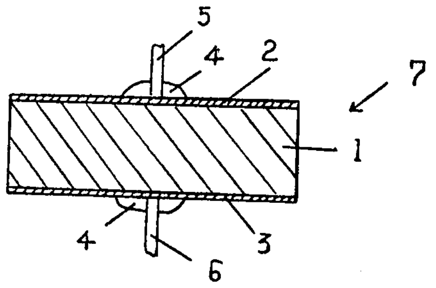
FIG. 1 is a cross-sectional view of an electromechanical transducer embodying the present invention.

Before proceeding with a detailed description of the piezoelectric materials contemplated by the invention, their application in electromechanical transducers will be described with reference to FIG. 1 of the drawings wherein reference character 7 designates, as a whole, an electromechanical transducer having, as its active element, a preferably disc shaped body 1 of piezoelectric ceramic materials according to the present invention.

Body 1 is electrostatically polarized, in a manner hereinafter set forth, and is provided with a pair of electrodes 2 and 3, applied in a suitable manner, on two opposed surfaces thereof. Wire leads 5 and 6 are attached conductively to the electrodes 2 and 3 respectively by means of solder 4. When the ceramic is subjected to shock, vibration or other mechanical stress, an electrical output generated from the ceramic disc 1 can be detected from wire leads 5 and 6. Conversely, as with other piezo electric transducers, the application of an electrical voltage to electrodes 5 and 6 will result in the mechanical deformation of the ceramic body 1. It is to be understood that the term, electromechanical transducer, as used herein, is utilized in its broadest sense and includes piezoelectric ceramic filters, piezoelectric transformers, frequency control devices, and the like. Moreover the invention may also be used in and adapted to various other applications requiring materials having dielectric, piezo electric and/or electrostrictive properties.

According to the present invention, the ceramic body 1 (FIG. 1, is formed of novel piezoelectric compositions which are polycrystalline ceramics composed of $Pb(Sn_{1/3}Nb_{2/3})O_3$—$PbTiO_3$—$PbZrO_3$, $Pb(Sn_{1/3}Nb_{2/3})O_3$—$PbTiO_3$ or $Pb(Sn_{1/3}Nb_{2/3})O_3$—$PbZrO_3$, all modified with $MnO_2$ additive.

DETAILED DESCRIPTION OF THE INVENTION

The present invention is based on the discovery that within certain particular compositional ranges of these systems the specimens modified with $MnO_2$ additive exhibit very high mechanical quality factors and high electromechanical coupling coefficients along with high stabilities in resonant frequency and mechanical quality factor ($Q_M$) over wide temperature and time ranges.

The ceramic compositions of the present invention have various advantages in the processes for their manufacture and in their application for ceramic transducers. It has been known that the evaporation of PbO during firing is a problem encountered in the sintering of lead compounds such as lead titanate-zirconate. The compositions of the invention, however, evidence a smaller amount of evaporated PbO than the usual lead titanate zirconates upon firing. The system of the present invention can be fired without maintenance of a PbO atmosphere. A well sintered body according to the present composition is obtained by firing the above-described composition in a ceramic crucible covered with a ceramic cover made of $Al_2O_3$ ceramics. A high sintered density is desirable for resistance to humidity and high piezo electric response when the sintered body is utilized as a resonator and for other applications.

Figure 2:
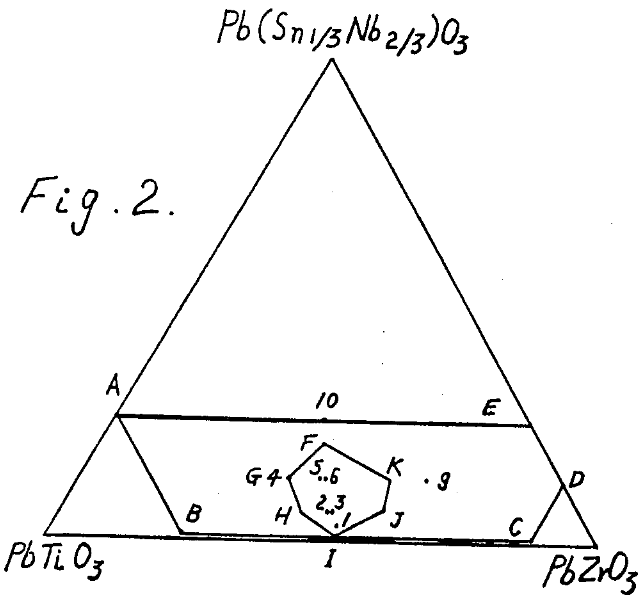
FIG. 2 is a triangular compositional diagram of the materials utilized in the present invention.

All possible compositions coming within the system $Pb(Sn_{1/3}Nb_{2/3})O_3$—$PbTiO_3$—$PbZrO_3$ are represented by the triangular diagram constituting FIG. 2 of the drawings. Some compositions represented by the diagram, however, do not exhibit high piezoelectricity, and many are electromechanically active only to a slight degree. The present invention is concerned with those basic compositions exhibiting piezoelectric response of appreciable magnitude. As a matter of convenience, the planar coupling coefficient ($K_p$) of test discs will be taken as a measure of piezoelectric activity. Thus, within the area bounded by lines connecting points A, B, C, D, and E of the diagram of FIG. 2, all compositions polarized and tested showed a planar coupling coefficient of approximately 0.1 or higher. The basic compositions in the area of the diagram of FIG. 2 bounded by lines connecting points F, G, H, I, J and K exhibit a planar coupling coefficient of approximately 0.5 or higher. The molar percentages of the three components of the compositions A, B, D, C, E, F, G, H, I, J and K are as follows:

| | $Pb(Sn_{1/3}Nb_{2/3})O_3$ | $PbTiO_3$ | $PbZrO_3$ |
|---|---|---|---|
| A | 25.0 | 75.0 | — |
| B | 1.0 | 75.0 | 24.0 |
| C | 1.0 | 11.5 | 87.5 |
| D | 12.5 | — | 87.5 |
| E | 25.0 | — | 75.0 |
| F | 20.0 | 40.0 | 40.0 |
| G | 12.5 | 50.0 | 37.5 |
| H | 6.0 | 51.0 | 43.0 |
| I | 1.0 | 47.0 | 52.0 |
| J | 6.0 | 36.0 | 58.0 |
| K | 12.5 | 31.5 | 56.0 |

The compositions described herein may be prepared in accordance with various well known ceramic procedures. A preferred method, however, hereinafter more fully described contemplates the use of PbO or $Pb_3O_4$, $SnO_2$, SnO, $Nb_2O_5$, $TiO_2$, $ZrO_2$ and $MnO_2$ as starting materials.

tric ceramic products can be easily obtained simply by covering the samples with an alumina crucible during firing.

The sintered ceramics were polished on both surfaces to a thickness of 0.5 millimeter. The polished disc surfaces were then coated with silver paint and fired to form silver electrodes. Finally, the discs were polarized while immersed in a bath of silicone oil at 100° C. A voltage gradient of D-C 4 KV per mm was maintained for 1 hour, and the discs field-cooled to room temperature in 30 minutes.

The piezoelectric and dielectric properties of the polarized specimen have been measured at 20° C. in a relative humidity of 50 percent and at a frequency of 1 Kc. Examples of specific ceramic compositions according to this invention and various pertinent electromechanical and dielectric properties thereof are given in Table I. From Table I it will be readily evident that all exemplary compositions modified with $MnO_2$ additive are characterized by very high mechanical quality factor and high planar coupling coefficient, all of which properties are important to the use of piezoelectric compositions in ceramic filter, piezoelectric transformer and ultra-sonic transducer applications. It will be obvious that the compositions modified with $MnO_2$ additive exhibit a remarkable improvement in mechanical quality factor ($Q_M$) as compared with that of basic compositions; i.e. the basic compositions without $MnO_2$ exhibit a $Q_M$ of approximately 200 or lower.

TABLE I

| Example No. | Mole percent of basic composition | | | $MnO_2$ additive, percent by weight | 24 hours after poling | | |
|---|---|---|---|---|---|---|---|
| | $Pb(Sn_{1/3}Nb_{2/3})O_3$ | $PbTiO_3$ | $PbZrO_3$ | | Dielectric constant, $\epsilon$ | Planar coupling coeff., $K_p$ | Mechanical quality factor, $Q_M$ |
| 1 | 3.0 | 46.0 | 51.0 | 0.5 | 556 | 0.50 | 340 |
| 2 | 6.0 | 46.0 | 48.0 | 0.2 | 1089 | 0.54 | 400 |
| 3 | 6.0 | 45.0 | 49.0 | 0.5 | 1120 | 0.62 | 1,550 |
| 4 | 12.5 | 50.0 | 37.5 | 0.5 | 837 | 0.52 | 730 |
| 5 | 12.5 | 44.5 | 43 0 | 0.5 | 1159 | 0.60 | 1,120 |
| 6 | 12.5 | 43.5 | 44.0 | 0.2 | 1494 | 0.57 | 350 |
| 7 | 12.5 | 43.5 | 44.0 | 1.0 | 973 | 0.56 | 990 |
| 8 | 12.5 | 43.5 | 44.0 | 3.0 | 768 | 0.40 | 490 |
| 9 | 12.5 | 25.0 | 62.5 | 0.5 | 484 | 0.43 | 2,000 |
| 10 | 25.0 | 37.5 | 37.5 | 0.5 | 899 | 0.47 | 1,910 |

The starting materials, viz., lead oxide (PbO), stannic oxide ($SnO_2$), niobia ($Nb_2O_5$), titania ($TiO_2$), zirconia ($ZrO_2$) and $MnO_2$, all of relatively pure grade (e.g., C.P. grade) are intimately mixed in a rubber-lined ball mill with distilled water. In milling the mixture care should be exercised to avoid contamination thereof due to wear of the milling ball or stones. This may be avoided by varying the proportions of the starting materials to compensate for any contamination.

Following the wet milling, the mixture is dried and mixed to insure as homogeneous a mixture as possible. Thereafter, the mixture is suitably formed into desired forms at a pressure of 400 Kg/cm². The compacts are then pre-reacted by calcination at a temperature of about 850° C. for about 2 hours.

After calcination, the reacted material is allowed to cool and is then wet milled to a small particle size. $MnO_2$ additive may be added to the reacted material after calcination of raw materials which did not originally include $MnO_2$ and then the reacted material containing $MnO_2$ additive is milled to a small particle size. Once again, care should be exercised as above to avoid contamination by wear of the milling balls or stones. Depending on preference and the shapes desired the material may be formed into a mix or slip suitable for pressing, slip casting, or extruding, as the case may be, in accordance with conventional ceramic forming procedures. The samples for which data are given hereinbelow were prepared by mixing 100 grams of the milled pre-sintered mixture with 5 cc of distilled water. The mix was then pressed into discs of 8 mm diameter and 1 mm thickness at a pressure of 700 Kg/cm². The pressed discs were fired at 1,210°–1,310° C. for 45 minutes. According to the present invention, there is no need to fire the composition in an atmosphere of PbO. Moreover, there is no need to maintain a special temperature gradient in the firing furnace as is necessary in prior art procedures. Thus, according to the present invention, uniform and excellent piezoelec- The basic compositions of the foregoing examples are indicated in the diagram of FIG. 2 by points numbered correspondingly.

From the foregoing Table I, it will be obvious that the values of mechanical quality factor, planar coupling coefficient and dielectric constant can be varied to suit various applications by selecting the base composition and amounts of $MnO_2$ additive.

From Table II it will be evident that the piezoelectric ceramics of this invention exhibit a high resonant frequency stability over a wide temperature range and that these ceramics exhibit a high stability in mechanical quality factor ($Q_M$) over a temperature range of 30° to 110° C.

TABLE II

| Example No. | $Q_M$-T. C., percent | $f_r$-T. C., percent |
|---|---|---|
| 1 | 5.4 | 0.334 |
| 2 | 12.5 | 0.231 |
| 3 | 23.2 | 0.361 |
| 4 | 27.7 | 0.192 |
| 5 | 15.3 | 0.017 |
| 6 | 6.6 | 0.038 |
| 7 | 10.4 | 0.024 |
| 8 | 20.8 | 0.351 |
| 9 | 5.0 | 0.361 |
| 10 | 24.1 | 0.274 |

$Q_M$-T.C. is the change in mechanical quality factor ($Q_M$) within the range 30° to 110° C. $f_r$-T.C. is the change in resonant frequency ($f_r$) within the range 30° to 110° C.

These properties are important to the use of piezoelectric compositions in piezoelectric transformer and filter applications etc. The term piezoelectric transformer is here employed to describe a passive electrical energy transfer device or transducer employing the piezoelectric properties of the material of which they are constructed to achieve a transformation of voltage, current or impedance. It is desirable for this application of the ceramics that the piezoelectric materials exhibit a high stability in resonant frequency and mechanical quality factors over a wide temperature range and exhibit very high mechanical quality factors and high electromechanical coupling coefficients in order that the piezoelectric transformer utilized in a T.V. set etc., exhibits a high stability with temperature in output voltage and current.

According to the present invention, the piezoelectric ceramics have high electromechanical coupling coefficients. Therefore, the ceramics of the invention are also suitable for use in electromechanical transducer elements such as phonograph pickups, microphones and voltage generators in ignition systems.

In ceramic compositions containing $MnO_2$ additive in amounts more than 5 weight percent, the mechanical quality factor is relatively low and the planar coupling coefficient is low. Ceramic compositions containing an amount of $MnO_2$ additive less than 0.1 weight percent exhibit a low mechanical quality factor. For these reasons they are excluded from the scope of the present invention.

In addition to the superior properties shown above, compositions according to the present invention yield ceramics of good physical quality and which polarize well. It will be understood from the foregoing that the ternary solid solution $Pb(Sn_{1/3}Nb_{2/3})O_3$—$PbTiO_3$—$PbZrO_3$ modified with the specified amounts of $MnO_2$ additive form excellent piezoelectric ceramic bodies.

While there have been described what at present are believed to be the preferred embodiments of this invention, it will be obvious that various changes and modifications can be made therein without departing from the invention. It is our intention, therefore, to cover in the appended claims all such changes and modifications as fall within the true spirit and scope of the invention.

What is claimed is:

1. A piezoelectric ceramic composition consisting essentially of a solid solution of a material selected from the area bounded by lines connecting points A, B, C, D and E of the diagram of FIG. 2, and further containing a quantity of manganese equivalent to from 0.1 to 5 weight percent of manganese oxide ($MnO_2$), wherein the compositions of the points A, B, C, D and E have the following formulas:

A. $Pb(Sn_{1/3}Nb_{2/3})_{0.250}Ti_{0.750}O_3$
B. $Pb(Sn_{1/3}Nb_{2/3})_{0.010}Ti_{0.750}Zr_{0.240}O_3$
C. $Pb(Sn_{1/3}Nb_{2/3})_{0.010}Ti_{0.115}Zr_{0.875}O_3$
D. $Pb(Sn_{1/3}Nb_{2/3})_{0.125}Zr_{0.875}O_3$
E. $Pb(Sn_{1/3}Nb_{2/3})_{0.250}Zr_{0.75}O_3$ .

2. A process for the preparation of the ceramic composition of claim 1 comprising (1) intimately wet-mixing a lead oxide, a tin oxide, $Nb_2O_5$, $TiO_2$, $ZrO_2$ and $MnO_2$; (2)drying said mixture; (3) pressing said mixture into a pre-determined shape; (4) pre-reacting said mixture by calcining at a temperature of about 850° C. for about 2 hours (5) cooling said calcined mixture; (6) reducing said mixture to a smaller particle size; (7) shaping said particulate mixture, and (8) firing said shaped mixture at about 1,210°–1,310° C. for about 45 minutes.

3. A piezoelectric ceramic composition consisting essentially of a solid solution of a material selected from the area bounded by lines connecting points F, G, H, I, J and K of the diagram of FIG. 2, and further containing a quantity of manganese equivalent to from 0.1 to 5 weight percent of manganese oxide ($MnO_2$), wherein the compositions of the points F, G, H, I, J and K have the following formulas:

F. $Pb(Sn_{1/3}Nb_{2/3})_{0.200}Ti_{0.400}Zr_{0.400}O_3$
G. $Pb(Sn_{1/3}Nb_{2/3})_{0.125}Ti_{0.500}Zr_{0.375}O_3$
H. $Pb(Sn_{1/3}Nb_{2/3})_{0.060}Ti_{0.510}Zr_{0.430}O_3$
I. $Pb(Sn_{1/3}Nb_{2/3})_{0.010}Ti_{0.470}Zr_{0.520}O_3$
J. $Pb(Sn_{1/3}Nb_{2/3})_{0.060}Ti_{0.360}Zr_{0.580}O_3$
K. $Pb(Sn_{1/3}Nb_{2/3})_{0.125}Ti_{0.315}Zr_{0.560}O_3$.

4. An electromechanical transducer element comprising a ceramic composition as claimed in claim 3.

5. A piezoelectric transformer comprising a ceramic composition as claimed in claim 3.

6. A piezoelectric ceramic material consisting essentially of the solid solution having the following formula: $Pb(Sn_{1/3}Nb_{2/3})_{0.060}Ti_{0.460}Zr_{0.480}O_3$, and further containing 0.5 weight percent of manganese oxide ($MnO_2$).

7. A piezoelectric ceramic material consisting essentially of the solid solution having the following formula: $Pb(Sn_{1/3}Nb_{2/3})_{0.125}Ti_{0.445}Zr_{0.430}O_3$, and further containing 0.5 weight percent of manganese oxide ($MnO_2$).

* * * * *